US008810271B2

(12) United States Patent
Voltan et al.

(10) Patent No.: US 8,810,271 B2
(45) Date of Patent: Aug. 19, 2014

(54) METHOD AND APPARATUS FOR TESTING PHOTOVOLTAIC DEVICES

(75) Inventors: Alessandro Voltan, Legnaro (IT); Giorgio Cellere, Torri di Quartesolo (IT); Gaudenzio Meneghesso, Piovene Rocchette (IT); Matteo Meneghini, Campodarsego (IT); Diego Barbisan, Onigo di Pederobba (IT); Enrico Zanoni, Padua (IT)

(73) Assignee: Applied Materials Italia S.R.L., San Biagio di Callalta (IT)

( * ) Notice: Subject to any disclaimer, the term of this patent is extended or adjusted under 35 U.S.C. 154(b) by 119 days.

(21) Appl. No.: 13/550,398

(22) Filed: Jul. 16, 2012

(65) Prior Publication Data

US 2013/0021054 A1 Jan. 24, 2013

Related U.S. Application Data

(60) Provisional application No. 61/567,986, filed on Dec. 7, 2011.

(30) Foreign Application Priority Data

Jul. 19, 2011 (IT) .............................. UD2011A0115

(51) Int. Cl.
*G01R 31/26* (2014.01)
*G01R 31/40* (2014.01)
*F21S 8/00* (2006.01)
*G01R 31/00* (2006.01)

(52) U.S. Cl.
CPC .......... *G01R 31/405* (2013.01); *G01R 31/2605* (2013.01); *F21S 8/006* (2013.01)
USPC ..................................... 324/761.01; 324/501

(58) Field of Classification Search
USPC .............. 324/501, 761.01; 250/205; 136/206, 136/244
See application file for complete search history.

(56) References Cited

U.S. PATENT DOCUMENTS 4,204,765 A * 5/1980 Iannadrea et al. ............... 356/71
6,175,408 B1 * 1/2001 Henze et al. ................ 356/238.3
6,548,819 B1 * 4/2003 Lovelady ................... 250/495.1

(Continued)

FOREIGN PATENT DOCUMENTS

WO WO-2010/057935 5/2010

OTHER PUBLICATIONS

International Search Report and Written Opinion of the International Searching Authority mailed Aug. 20, 2012 in PCT/EP2012/064106.

*Primary Examiner* — Jermele M Hollington
*Assistant Examiner* — Raul Rios Russo
(74) *Attorney, Agent, or Firm* — Patterson & Sheridan, LLP

(57) ABSTRACT

The present invention generally relates to an apparatus used for simulating spectrum of solar radiation and testing a photovoltaic device using the simulated spectrum of solar radiation. In one embodiment, the apparatus includes a light-source device configured to reproducing spectrum of solar radiation, the light-source device comprising a radiation plate divided into a plurality of cells, and each of the cells comprises a plurality of light-emitting diodes emitting at least two different wavelengths, and a substrate support disposed opposite to the light-source device. In one example, the plurality of light-emitting diodes emit a wavelength that is selected from the group consisting of colors blue, green, yellow, red, a first and a second color in infrared having different wavelengths with respect to each other.

15 Claims, 3 Drawing Sheets

(56) References Cited

U.S. PATENT DOCUMENTS

| | | |
|---|---|---|
| 7,411,408 B2 * | 8/2008 | Shimotomai et al. .... 324/754.23 |
| 2004/0020529 A1 * | 2/2004 | Schutt et al. ................. 136/245 |
| 2007/0119496 A1 * | 5/2007 | Baldo et al. ................... 136/252 |
| 2010/0276571 A1 * | 11/2010 | Wang et al. .................... 250/205 |
| 2011/0241549 A1 * | 10/2011 | Wootton ........................ 315/117 |

* cited by examiner

METHOD AND APPARATUS FOR TESTING PHOTOVOLTAIC DEVICES

CROSS-REFERENCE TO RELATED APPLICATIONS

This application claims benefit of U.S. provisional patent application Ser. No. 61/567,986, filed Dec. 7, 2011, which is herein incorporated by reference.

BACKGROUND OF THE INVENTION

1. Field of the Invention

The present invention generally relates to a method and apparatus for testing photovoltaic devices.

2. Description of the Related Art

In the production of photovoltaic devices, it is well known to use devices to reproduce a radiation that simulates the solar spectrum to carry out necessary tests and inspections on objects to verify operating reliability and overall conversion efficiency of photovoltaic devices under laboratory conditions.

The industry have developed standards that define solar simulator performance in three performance areas: spectral frequencies match to the solar spectrum, spatial uniformity of irradiance on the surface of the object to be illuminated, and temporal stability of light quantity produced. In the conventional solar simulators, xenon arc lamps have been widely used. However, xenon type lamps have some drawbacks. For example, the light produced by the xenon arc lamps contains fairly strong intensity peaks in the near infrared region that are not found in any of the standard solar spectra. Accordingly, xenon arc lamps suffer from poor homogeneity of output light distribution and irradiance efficiency, as well as poor spectral accuracy between the spectrum produced by such lamps and the solar spectrum.

Another drawback of xenon type lamps is that the output light spectrum is typically adjusted by varying the intensity of light by controlling the electric current and voltage supplied to the lamps. However, modifying these parameters generally affects all the wavelengths produced by the lamps. Therefore, it is not possible to select and modify individual wavelength so that the light spectrum produced by the lamps in different applications are as similar as possible to solar spectrum.

A further drawback of xenon type lamps is that irradiance intensity of the lamps is normally not stable but subjected to fluctuations due to variations in the current (supplied to different lamps) caused by a change in environment or power conditions. This influences the amount of fluctuations in the output spectrum produced by the lamps and therefore the reliability and repeatability of the results obtained from the tests.

Therefore, there is a need in the art to improve reproducibility and efficiency of the output spectrum produced by solar simulators under any given circumstances.

SUMMARY OF THE INVENTION

In one embodiment, an apparatus includes a light-source device configured to reproduce light having a spectrum similar to solar radiation, the light-source device comprising a radiation plate being divided into a plurality of cells or zones, wherein each of the cells comprises a plurality of light-emitting diodes emitting at least two different wavelengths (colors), and a substrate support disposed opposite to the light-source device. Each of the plurality of light-emitting diodes are configured to emit a wavelength that is selected from the group consisting of colors blue, green, yellow, red, at least a first and a second color in infrared having different wavelengths with respect to each other. In one aspect, one or more sensors may be disposed in proximity to the substrate support to detect the radiation emitted by the radiation plate. A control system may be connected to the one or more sensors and adapted to receive the information associated with the spectrum actually emitted over time by the radiation plate and to regulate the emission parameters at least to minimize the fluctuations and to spatially homogenize the radiation emitted.

In another embodiment, a method for testing a photovoltaic device is provided. The method include providing a light-source device to emit at least two different wavelengths toward a photovoltaic device, the at least two different wavelengths provide an output spectrum that simulates solar radiation, detecting the output spectrum emitted by the light-source device, comparing the output spectrum emitted by the light-source device with a predetermined spectrum to be emitted, and correcting functioning parameters of the light-source device to eliminate variations between the output spectrum emitted by the light-source device and the predetermined spectrum to be emitted.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
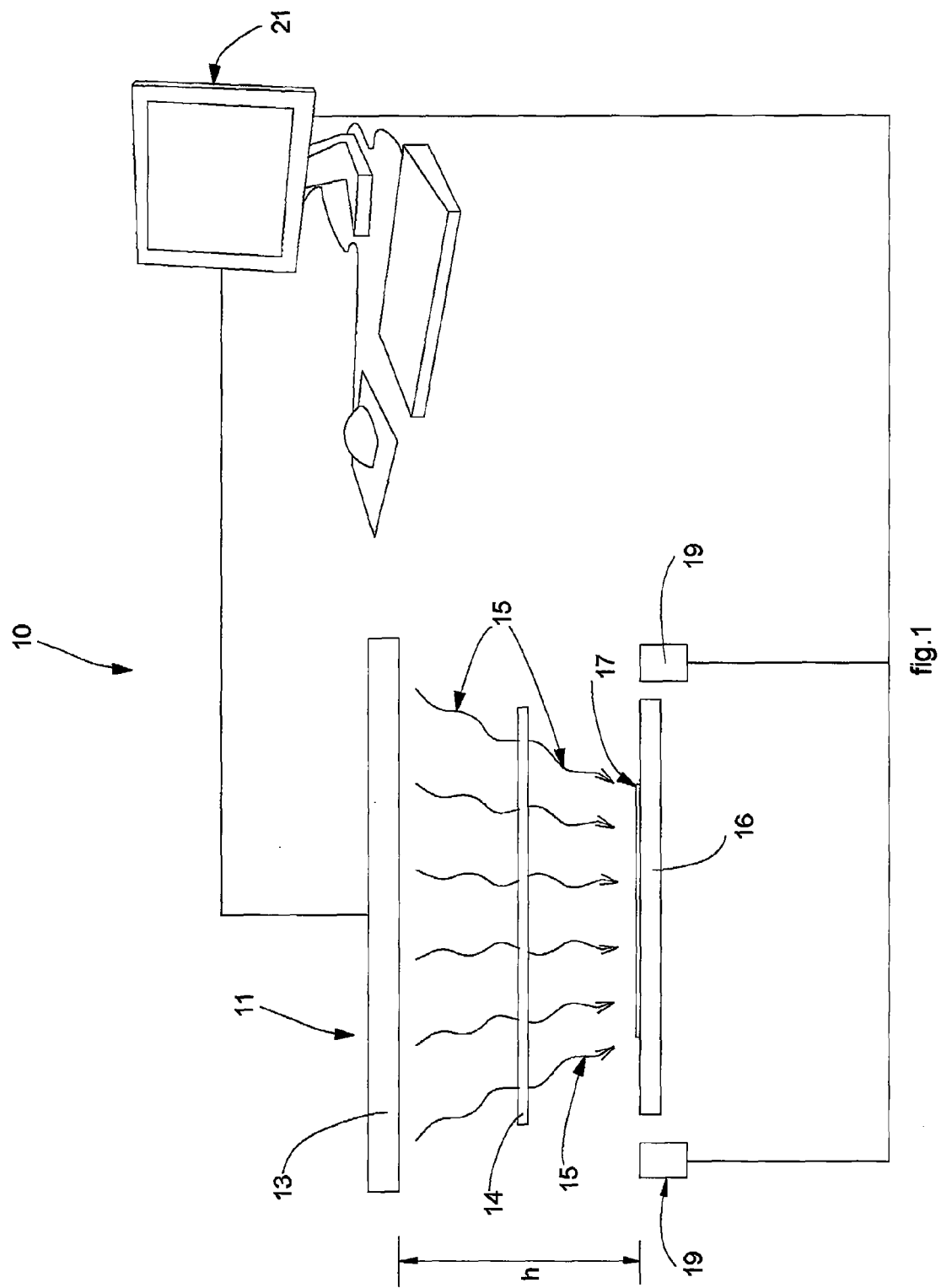
FIG. 1 schematically shows a testing and inspecting device that uses a solar simulator for reproducing solar radiation according to one embodiment of the present invention.

Embodiments discussed herein relate to a light-source device used in closed environments, such as laboratories or testing chambers, for reproducing or simulating the spectrum of solar radiation with the purpose of testing/inspecting photovoltaic devices or other comparable devices. In various embodiments of the present invention, the light-source device may include at least a semiconductor-based light source, such as light-emitting diodes (LEDs). It is contemplated that any other semiconductor-based light source, for example, laser diodes (LDs) may be used. In the context of the present invention, the term "LED lamps" may refer to a single containment structure (where LED chips can be placed) or multiple containment units incorporated in any desired pattern onto a single containment structure.

In various embodiments of the present invention, the light-source device may include one or more LED lamps. In one example, two or more LED lamps may be disposed facing toward the surface of the photovoltaic device to be tested. In cases where at least two LED lamps are provided, the number and position of which with respect to the surface of the object to be tested are arranged depending upon specific circumstances and applications in order to obtain an optimal spatial homogeneity of the light radiations produced on the surface of the object to be illuminated. Using LED lamps instead of the traditional lamps, in particular Xenon lamps as discussed above, allows obtaining a light spectrum close on the average to that of natural sunlight in terms of luminous intensity and light quality, without having the problems of Xenon lamps. Particularly, the LED lamps present many advantages over the traditional lamps such as lower energy consumption and longer service life.

In various embodiments of the present invention, the LED lamps that are used in the light-source device according to the present invention may be configured to emit at least two different wavelengths. The at least two different wavelengths may be selected over the entire emission spectrum of frequencies of solar radiation. In one example, the at least two different wavelengths are selected from the following colors: blue, yellow, green, red, and at least two different colors in the infrared wavelength range. It should be understood that the term "infrared" as used herein does not describe any particular wavelength of light commonly classified as infrared. Rather, the term "infrared" refers to an entire range of wavelengths. In one example, the nominal wavelength of the blue color LED lamps are between about 450 and about 500 nm, the nominal wavelength of the yellow color LED lamps are between about 570 and about 590 nm, the nominal wavelength of the green color LED lamps are between about 500 and about 570 nm, the nominal wavelength of the red color LED lamps are between about 610 and about 760 nm and the nominal wavelength of the infrared color LED lamps are between about 760 and about 1000 nm. In some embodiments, one or more of the LED lamps may use other lamp output colors, such as ultraviolet (e.g., <400 nm), violet (e.g., 400-450 nm), orange (e.g., 590-610 nm), purple, pink or other useful color.

FIG. 1 schematically shows a testing and inspecting device 10 that is used to perform tests and inspections on a solar/photovoltaic device 17 placed on a support 16. While solar/photovoltaic devices are specifically discussed in the following description, it is understood that the invention is applicable to other substrates or devices that require the illumination of a light radiation that simulates the solar spectrum. The testing and inspecting device 10 generally includes a light-source device such as a solar simulator 11 and a support 16 on which the solar/photovoltaic device 17 is placed. The solar simulator 11 includes a radiation plate 13 configured to emit an electromagnetic radiation 15 toward the solar/photovoltaic device 17 placed on the support 16. In one configuration, as illustrated in FIG. 1, the radiation plate 13 is disposed a distance "h" from the solar/photovoltaic device 17. The distance "h" between the radiation plate 13 and the solar/photovoltaic device 17 can vary between 50 mm to 800 mm and more, depending on the number of LED lamps that are used and on the capacity of the LED's to guarantee a spatial uniformity of the radiation emitted over the whole surface of the solar/photovoltaic device 17 to be tested.

In order to render output light as homogeneous as possible to enhance the overall irradiance efficiency, one or more optical lenses 14 may be optionally provided in an intermediate position between the radiation plate 13 and the support 16 such that the electromagnetic radiation 15 passing through the one or more lenses 14 is homogenized and reaches the entire surface of the solar/photovoltaic device 17 with maximized light distribution performance. The optical lenses 14 may be made of plastic materials, such as acrylic, polymethyl methacrylate (PMMA), polyvinyl chloride (PVC), polycarbonate (PC), high-density polyethylene (HOPE). Alternatively, the optical lenses 14 may be made of vitreous materials such as quartz.

The testing and inspecting device 10 may also include one or more sensors 19 disposed in proximity to the solar/photovoltaic device 17 to be tested. The sensors 19 are configured to convert the electromagnetic radiation 15 into electrical signals for accurate measurement of light intensity and/or spectrum obtained by the solar/photovoltaic device 17. The type of sensors 19 used is dependent on the light spectrum used to illuminate the device 17. The sensors 19 may be any photodetector, such as photodiodes, that is capable of converting light into electrical signals for accurate measurement of spectrum. The photodiode can be a Si-based, Ge-based, or GaAs-based photodiode. For example, silicon-based photodiodes are sensitive to both visible light and infrared light. Photodiodes made from different semiconductor materials are sensitive to different wavelengths of incident light. For example, Gallium-Arsenide (GaAs) based photodiodes are sensitive to both visible and ultraviolet light. By comparing the spectrum produced by the LED lamps and the solar spectrum (also in real time), it is possible to correct variations between the spectrum emitted by the LED lamps and a target spectrum. The correction may be associated with all or a portion of the LED lamps in terms of any particular wavelengths of interest, depending upon the application.

In one embodiment, the one or more sensors 19 are disposed adjacent to the upper surface of the support 16, or any suitable position that is close to the surface of the solar/photovoltaic device 17 and is illuminated by the electromagnetic radiation 15. One embodiment of the invention provides that there are at least two sensors 19 for each side of solar/photovoltaic device 17. Another embodiment provides that a control LED is located adjacent to each sensor 19 to control the operation of the sensor 19. In one embodiment, the control LED is selected to have a wavelength between the wavelengths of two of the LED lamps. In another embodiment, the control LED has a wavelength that is the same as one of the wavelengths of an LED lamp found in the testing and inspecting device 10. In one configuration, the control LED may be positioned close to the one or more sensors 19 so as to verify the response of the sensor 19 as a function of time. In operation, after a certain period of functioning of the lamp, the LED is allowed to flash, the frequency spectrum of the sensor 19 is acquired and it is verified if the spectrum is constant over a period of time. If the response of the sensor 19 is out of a desired range, this means that the sensor is failed and must be replaced.

The one or more sensors 19 are connected to a control system 21 in order to transmit the information associated with the spectrum actually emitted over time by the radiation plate 13. The control system 21 is connected to the solar simulator 11 and configured to regulate and/or minimize the fluctuations of the luminous intensity of the LED lamps 103, also in real time, thus forming a closed loop control that allows one to form a repeatable high efficiency device that can enable a high throughput of the testing device. In fact, the closed loop control can provide information for the correction of the emission in real time, and therefore the correction can be performed without any dead or lost time. The control system 21 may include a central processing unit (CPU) (not shown), a memory (not shown), and support circuits (or I/O) (not shown). A program (or computer instructions/codes) readable by the control system may be provided in the control system 21 to store target spectrums to be reproduced according to the specific control parameters and the circumstances involved during the test. The command and control unit 21 may also be equipped with a database (not shown) in which a plurality of emission configurations are each stored and individually used by an operator according to the circumstances and the specific testing application.

In operation, the control system 21 may compare, on a predetermined temporal basis or in real time, the spectrum actually emitted by the LED lamps 103 of the radiation plate 13 with a target spectrum stored in the control system 21 and determine suitable corrections to be made. More precisely, the target spectrum may be designed so as to maximize the homogeneity the spectrum over the whole surface of the solar/photovoltaic device 17 to be tested and to maximize the stability over time of the radiation emitted. If the control system 21 detects differences from the comparison, the control system 21 may intervene on the functioning parameters of the radiation plate 13, modifying, for example, one or more electrical feed quantities, and/or the spatial or temporal distribution of the emission in order to eliminate any differences detected. In particular, the control system 21 is configured to guarantee that the radiation 15 emitted towards the cell 17 is distributed in a uniform and homogeneous way over the whole surface of the cell 17. If the sensors 19 detect that in one or more areas of the cell 17 the radiation is not uniform or not homogeneous with respect to other areas of the same cell, the control system 21 act on individual LED lamps 103, on a single LED or group of LED's, in order to modify the radiation emitted and restore the uniformity of the radiation on the whole cell 17. The present invention, thanks to the cell or zone design of the radiation plate 13, which is discussed below, and thanks to the distribution of the LED's within each cell or zone, one can modify and adjust the device parameters, for example, the current delivered to each LED independently from the other, to better control the process or testing results of the testing and inspecting device 10. Therefore, embodiments of the invention allows one to maintain, also in real time, the radiation emitted within the desired parameters, in particular regarding the spatial homogeneity and the stability over the time, avoiding localized peaks and varying amounts of radiation over different areas of the substrate to be tested.

Figure 2:
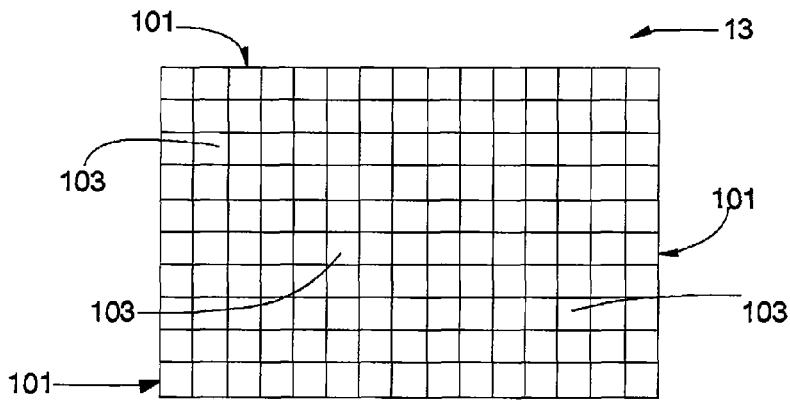
FIG. 2 shows an exemplary solar simulator according to one embodiment of the present invention.

FIG. 2 shows a side of an exemplary radiation plate 13 according to one embodiment of the present invention. The radiation plate 13 may be divided into a plurality of cells 101 that each defines a space that is sized and shaped for receiving one or more LED lamps 103. If desired, each cell 101 may provide its own configuration of LED lamps 103, with equal or different optical characteristics from a cell 101 that is adjacently positioned. The LED lamps 103 can be selectively activated or de-activated with respect to the others, depending upon the application, so that a desired wavelength distribution and amount of the electromagnetic radiation 15 is directed toward particular zones of the solar/photovoltaic device 17. In one example, the parameters of the input current can be selectively adjusted in relation to the emission zone to completely switch on or off one or more specific cells 101 in the radiation plate 13, thereby optimizing the spatial distribution of the emission of the radiation plate 13 with respect to particular region(s) of the device 17.

Figure 3A:
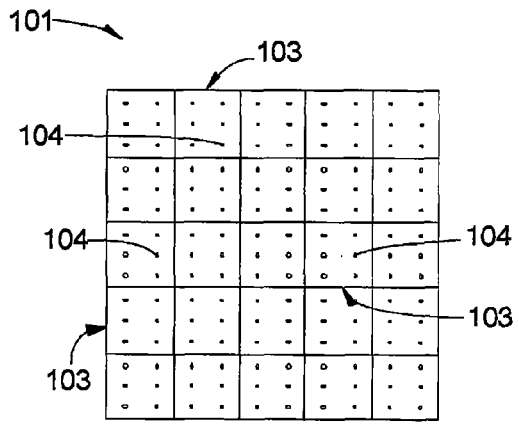
FIGS. 3a and 3b show possible configurations of a cell presented in the solar simulator of FIG. 2 according to one embodiment of the present invention.
Figure 3B:
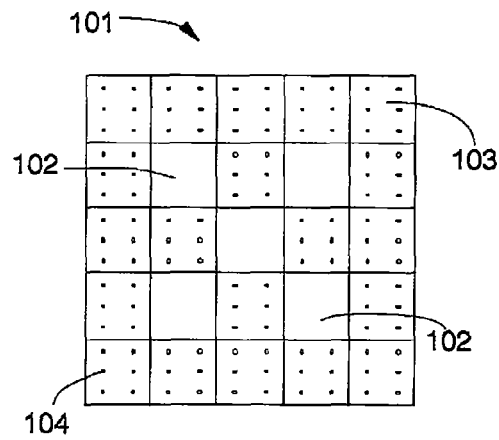

FIGS. 3a and 3b show possible configurations of a cell 101 in the radiation plate 13 of FIG. 2 according to the present invention. In one embodiment shown in FIG. 3a, the radiation plate 13 has dense array of LED lamps 103, which are disposed across the entire surface of the cell 101. In one configuration, each cell 101 contains a plurality of LED lamps 103 disposed in an aligned manner both vertically and horizontally. While in another embodiment, shown in FIG. 3b, the radiation plate 13 has a less dense array of LED lamps 103 within some of the cells 101. In this configuration, the LED lamps 103 may be intentionally deactivated, or not disposed within some areas of the cell 101, for example, empty spaces 102 as shown in FIG. 3b. The arrangement of the empty spaces 102 may be concentrated in the central zone or distributed around the cell 101, depending upon the application, to reduce the peaks of luminous intensity in the corresponding areas of the device 17 that could be detrimental to the integrity of the solar/photovoltaic device 17 that is being tested. In this way, the luminous intensity in the central or peripheral zone can be compared to that in the lateral or adjacent zones and adjusted as necessary to obtain a desired uniformity of emission over the entire surface of the device 17. It should be noted that the number of the cells 101 for each radiant plate 13 and the number of LED lamps 103 for each cell 101 may vary depending upon process requirements or specific operating conditions. Also, the arrangement of the LED lamps 103 in the cell 101 may vary and should not be limited to the configurations as shown in FIGS. 3a and 3b. For example, the LED lamps 103 may be aligned or staggered with respect to the adjacent ones according to the desired luminous intensity distribution pattern of the device 17.

Figure 4A:
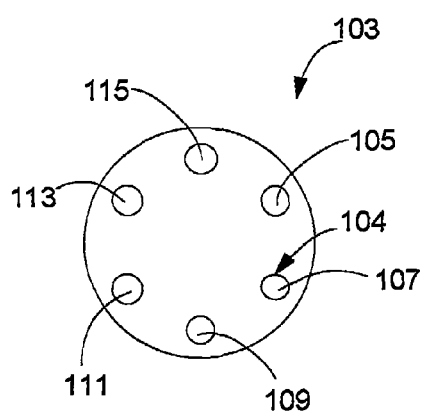
FIGS. 4a and 4b show possible arrangement of the LED lamps according to one embodiment of the present invention.
Figure 4B:
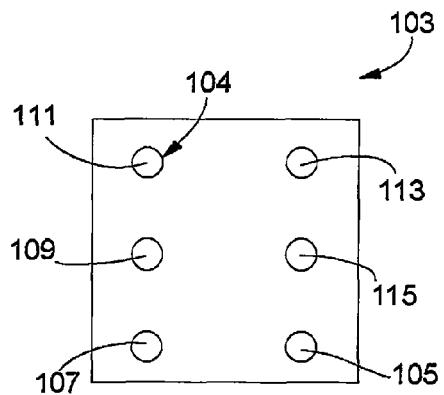

FIGS. 4a and 4b show possible arrangement of the LED lamps 103 in a cell 101 according to one embodiment of the present invention. FIG. 4a illustrates the LED lamp 103 containing a plurality of equally spaced LEDs 104 arranged in a circular configuration while FIG. 4b illustrates the LED lamp 103 containing a plurality of LEDs 104 arranged in a rectangular configuration. The particular color arrangement does not affect the light spectrum of the individual LED, but affects the homogeneity of the overall light emission so as to meet the requirement of the solar simulator. It is contemplated that the LEDs 104 may be of any configuration depending upon the desired luminous intensity distribution pattern.

In one example shown in FIGS. 4a and 4b, the LED lamp 103 is equipped with six LEDs 104 including a first LED 105 with a wavelength equal to that of blue, a second LED 107 with a wavelength equal to that of yellow, a third LED 109 with a wavelength equal to that of green, a fourth LED 111 with a wavelength equal to that of red, a fifth LED 113 with a wavelength in the infrared, and a sixth LED 115 with another wavelength in the infrared. The wavelength range of the infrared light for the fifth and sixth LEDs 113, 115 may range from about 0.7 um to about 1,000 um. The type and quantity of LEDs 104 presented inside the LED lamp 103 determines the spectral characteristic of the electromagnetic radiation 15 and are chosen on the basis of the different process requirements and characteristics of the solar/photovoltaic device 17 to be tested.

Figure 5:
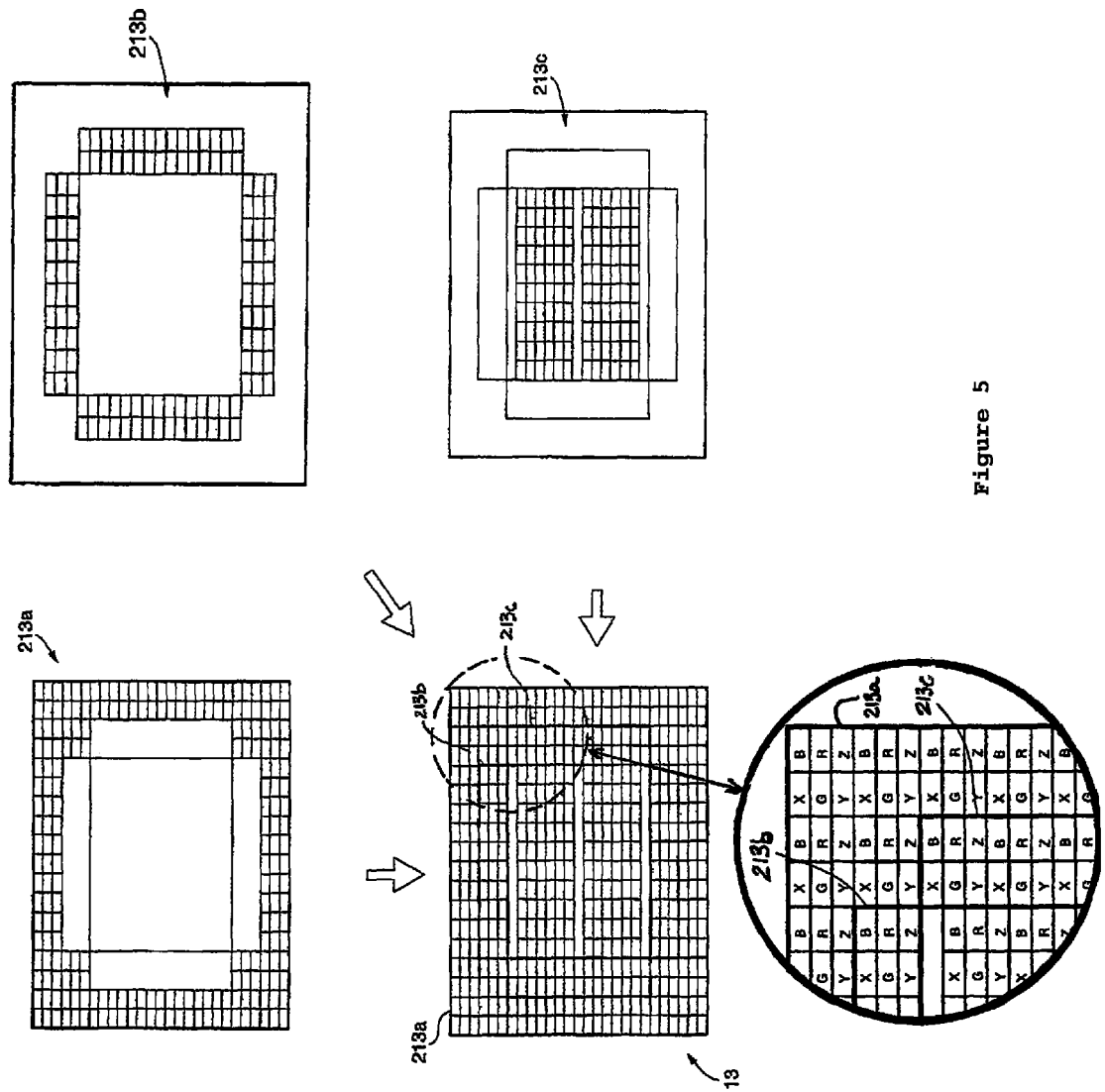
FIG. 5 shows a radiation plate being divided into three different zones according to another embodiment of the invention.

FIG. 5 shows a further embodiment of the invention in which the radiation plate 13 is divided in three different zones (lamps), respectively 213a, 213b and 213c. Each of the zones 213a, 213b, 213c comprises LED's of different wavelengths selected between green, blue, red and a first, a second or a third color in infrared having different wavelengths with respect to each other. Each of the zones 213a, 213b, 213c and each of the different type of LED's are independently driven by the control system 21 (FIG. 1) of the radiation plate 13, in order to render as high as possible the uniformity and homogeneity of the emitted radiation. If six colors, or six different wavelengths, are used for each zone, a number of 18 different currents must be used to drive separately each different color of each different zone. In this way, the use of different zones and different currents allows a very precise and specific control of the radiation emitted by each zone, so that a great degree of uniformity and homogeneity of the emission can be obtained for the whole surface of the solar/photovoltaic device 17 to be tested.

In some embodiments, the position of the LED lamps of each different color within the radiation plate 13 are positioned and/or configured to form a desired wavelength and intensity emission pattern to achieve a desired emission uniformity and/or homogeneity across the solar/photovoltaic device 17 to be tested. In one example, as illustrated in the close-up view of the radiation plate 13 shown in FIG. 5 (e.g., lower left corner), the LED lamps of each different color are positioned in a desired pattern to achieve a desired homogeneity or uniformity, wherein each different LED lamp type is identified in the illustrated close-up region by a respective letter (e.g., R (red), G (green), B (blue) and Y (yellow) and X and Z identify the two infrared colors). One skilled in the art will appreciate that the configuration of the LED lamps to achieve the desired emission uniformity and/or homogeneity in different regions or zones of the radiation plate 13, will vary as the emission intensity and density of the LED lamps in each region or zone varies, and thus the configuration shown in FIG. 5 is not intended to be limiting as to the scope of the invention described herein.

Further embodiments of the invention provide that temperature detectors are provided in a position near to the lamps. The temperature detectors, in one embodiment, can comprise thermocouples located in contact with at least one part of the lamp. The temperature detectors are connected to a control system that, in case of an increase of the temperature of the lamp over a predetermined level, commands the lamp to shut off. Another embodiment of the invention provides a thermal compensation system as part of the control system 21 to avoid any over temperature of the LED lamp 103 or of a part thereof. The thermal compensation system may be of the active type, such for example a system which uses the Peltier effect.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
a light-source device configured to reproducing spectrum of solar radiation, the light-source device comprising a radiation plate divided into a plurality of cells, and each of the cells comprises a plurality of light-emitting diodes emitting at least two different wavelengths;
a substrate support disposed opposite to the light-source device;
one or more sensors disposed in proximity to the substrate support to detect the radiation emitted by the radiation plate; and
a control system connected to the one or more sensors and adapted to receive the information associated with the spectrum actually emitted over time by the radiation plate and to regulate the emission parameters at least to minimize the fluctuations and to spatially homogenize the radiation emitted.

2. The apparatus of claim 1, wherein each of the cells of the radiation plate is independently controlled at least in the emission parameters of its light-emitting diodes.

3. The apparatus of claim 1, wherein the at least two different wavelengths are selected over the entire emission spectrum of solar radiation.

4. The apparatus of claim 1, wherein the plurality of light-emitting diodes emit a wavelength that is selected from the group consisting of colors blue, green, yellow, red, at least a first and a second color in infrared having different wavelengths with respect to each other.

5. The apparatus of claim 4, wherein the first and second color in infrared have a wavelength ranging from about 0.7 µm to about 1,000 µm.

6. The apparatus of claim 1, further comprising:
one or more optical lenses disposed between the light-source device and the substrate support.

7. The apparatus of claim 1, wherein the one or more sensors are disposed on each side of the substrate support.

8. The apparatus of claim 1, wherein the one or more sensors comprise semiconductor-based photodiodes.

9. A method for testing a photovoltaic device, comprising:
providing a light-source device to emit at least two different wavelengths toward a photovoltaic device, wherein the at least two different wavelengths provides an output spectrum simulating spectrum of solar radiation;
detecting the output spectrum emitted by the light-source device;
comparing the output spectrum emitted by the light-source device with a predetermined spectrum to be emitted; and
correcting functioning parameters of the light-source device to eliminate variations between the output spectrum emitted by the light-source device and the predetermined spectrum to be emitted, wherein the functioning parameters are regulated at least to minimize the fluctuations and to spatially homogenize the radiation emitted.

10. The method of claim 9, wherein the at least two different wavelengths are selected over the entire emission spectrum of solar radiation.

11. The method of claim 9, wherein the light-source device comprises a radiation plate divided into a plurality of cells, and wherein each cell comprises a plurality of light-emitting diodes.

12. The method of claim 11, wherein the plurality of light-emitting diodes emit a wavelength that is selected from the group consisting of colors blue, green, yellow, red, at least a first and a second color in infrared having different wavelengths with respect to each other.

13. The method of claim 9, wherein the correcting functioning parameters of the light-source device comprises:
de-activating light-emitting diodes located in a central region of the radiation plate.

14. The method of claim 9, wherein the correcting functioning parameters of the light-source device comprises:
de-activating light-emitting diodes located in a peripheral region of the radiation plate.

15. The method of claim 9, wherein the detecting the output spectrum emitted by the light-source device is performed through one or more sensors disposed in proximity to the photovoltaic device.

* * * * *